(12) United States Patent
Gidon et al.

(10) Patent No.: US 7,584,441 B2
(45) Date of Patent: Sep. 1, 2009

(54) METHOD FOR GENERATING OPTIMIZED CONSTRAINT SYSTEMS FOR RETIMABLE DIGITAL DESIGNS

(75) Inventors: Alexander Gidon, Karlsfeld (DE); David Knapp, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 952 days.

(21) Appl. No.: 10/665,880

(22) Filed: Sep. 19, 2003

(65) Prior Publication Data

US 2005/0062496 A1 Mar. 24, 2005

(51) Int. Cl.
*G06F 17/50* (2006.01)

(52) U.S. Cl. ......................................................... 716/6

(58) Field of Classification Search ............... 716/1–6, 716/11, 16–18, 9–10
See application file for complete search history.

(56) References Cited

U.S. PATENT DOCUMENTS

| | | | |
|---|---|---|---|
| 4,698,760 A | | 10/1987 | Lembach et al. |
| 5,649,176 A | * | 7/1997 | Selvidge et al. ............ 713/400 |
| 5,768,145 A | | 6/1998 | Roethig |
| 5,880,967 A | | 3/1999 | Jyu et al. |
| 5,917,729 A | | 6/1999 | Naganuma et al. |
| 6,096,091 A | | 8/2000 | Hartmann |
| 6,647,541 B2 | * | 11/2003 | LaBerge .................... 716/18 |
| 6,698,006 B1 | | 2/2004 | Srinivasan et al. |
| 6,701,506 B1 | | 3/2004 | Srinivasan et al. |
| 6,766,501 B1 | * | 7/2004 | Duggirala et al. ............ 716/11 |
| 7,299,425 B2 | * | 11/2007 | Grundmann .................... 716/1 |
| 2005/0132316 A1 | * | 6/2005 | Suaris et al. .................. 716/11 |
| 2006/0230369 A1 | * | 10/2006 | Cooke et al. .................... 716/4 |
| 2007/0174794 A1 | * | 7/2007 | Oktem et al. ................... 716/1 |
| 2007/0288871 A1 | * | 12/2007 | McElvain et al. .............. 716/2 |

* cited by examiner

*Primary Examiner*—Paul Dinh
(74) *Attorney, Agent, or Firm*—Townsend and Townsend and Crew, LLP

(57) ABSTRACT

A method for generating timing constraint systems, where the constrained object is a digital circuit., is provided, where the constraints are generated for the use of a digital logic optimization (synthesis) tool. The synthesis tool is used to optimize the circuit, under the applied constraints, so that the circuit exhibits certain desirable timing properties, while at the same time minimizing hardware cost and various other properties. The particular class of timing constraints generated by the disclosed invention is useful when the circuit is to be retimed after optimization. Typically, the joint use of the described invention and retiming results in improvements in the overall cost/performance tradeoff curve of the design. The invention comprises a method that comprises the following steps: (1) the flip-flops of the design are replaced with buffers having a negative delay whose magnitude is approximately the desired clock cycle time of the design; and (2) cycles in the design are broken using flip-flops having an infinite or quasi-infinite clock frequency. Following optimization by the synthesis tool, the temporary changes can be reverted, and retiming performed on the circuit.

15 Claims, 5 Drawing Sheets

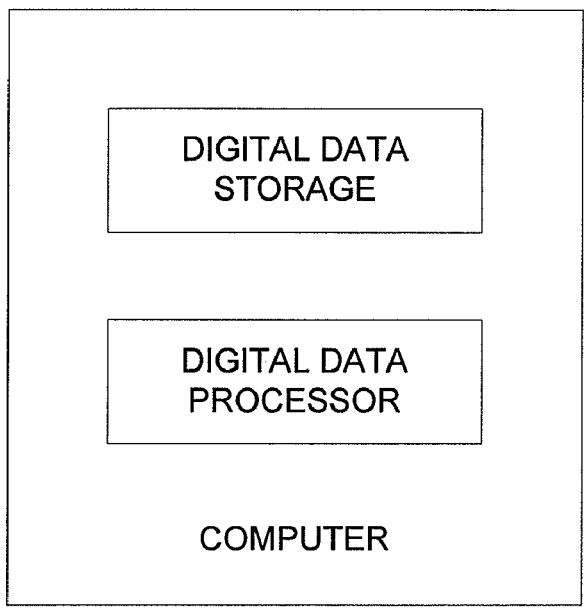
FIG. 12
FIG. 13
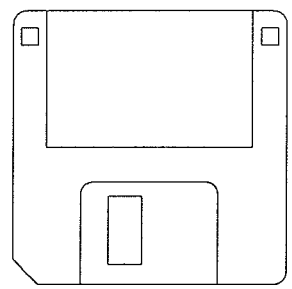
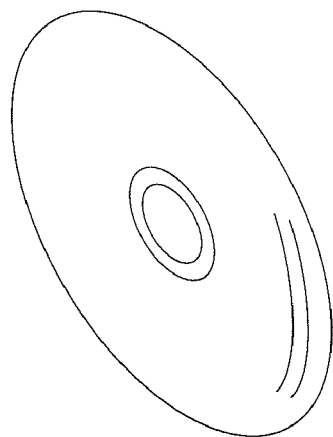
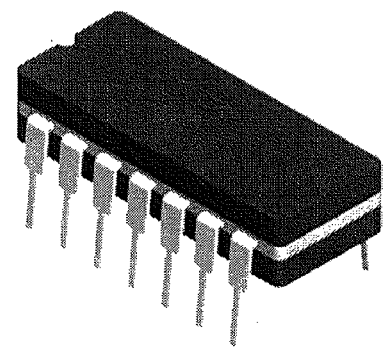

METHOD FOR GENERATING OPTIMIZED CONSTRAINT SYSTEMS FOR RETIMABLE DIGITAL DESIGNS

BACKGROUND OF THE INVENTION

1. Technical Field

The invention relates to a method for generating optimized timing constraint systems for retimable digital designs.

2. Description of the Prior Art

The following is a description of a generic logic synthesis system, with descriptive emphasis being given to those aspects of the system that are most relevant to the invention described herein. FIG. 1 shows the flow through a generic logic synthesis system 11 that features retiming, and that produces a netlist 19 expressing an optimized design. The input design 10 is expressed in a hardware description language (HDL), such as Verilog or VHDL. This text is analyzed, i.e. parsed and translated into an initial circuit representation 12. In the next step 14, a clock signal is declared, and a clock period is associated with the clock signal. A clock is present in both combinational and sequential circuits. In a combinational circuit the clock signal is a dummy, but the period must still be declared. In both the combinational and sequential cases, the clock period is used to constrain the timing of the circuit.

In the case of a combinational circuit, the paths being constrained begin at inputs and end at outputs. The clock period determines the allowable difference between the arrival time at the inputs and the required time at the outputs. Where additional timing offsets are needed, e.g. an additional delay on a particular input or output pin, these can be expressed as being with respect to the arrival/required times implicit in the clock period. Thus, for example, if one specifies a clock period of 100 nanoseconds, the default delay allowed between an input I and an output O is 100 nanoseconds. If there was a specific input pin X with an arrival time 10 nanoseconds later than the others, one would express this as being 10 nanoseconds late with respect to the declared clock.

In the case of a sequential circuit, a constrained path may begin either at a circuit input pin, or at the Q pin of a flip-flop. Paths end either at circuit output pins, or at D pins of flip-flops. The path delay constraint is the period of the clock that drives the flip-flops in the case where a path begins at a flip-flop and ends at a flip-flop. In other cases, the timing relationship between the I/O port and the flip-flop is computed in a manner known to practitioners of the art.

It is sometimes helpful to visualize this kind of timing constraint system implemented by collections of variously colored tokens. Each token is colored with a color corresponding to a particular clock. A token is launched at either an input pin or at the Q of a flip-flop clocked by the clock whose color the token bears. It is propagated through combinational logic, accumulating delay as it propagates, and finally it arrives at, and is absorbed by, either an output pin or the D pin of a flip-flop. The timing relationship (if there is one) between the token and its final destination can then be determined by comparing the colors of the token and the clock that constrains the flip-flop or output. Thus, for example, if a green token arrives at a D pin of a blue-clocked flip-flop, then the permissible delay accumulated on the token must be less than or equal to the worst-case time between the valid edges of the green and blue clocks, if such a worst-case time is defined. If a worst-case time is not defined, then the token is ignored and no constraint is adduced.

For purposes of logic synthesis, it is also convenient to imagine a second set of tokens being propagated backwards through the same circuit, in a symmetrical manner, with delays being subtracted instead of added, thus computing required times.

The term 'slack' is used to denote the difference between the arrival and the required time at a particular net or pin of the circuit. A positive slack characterizes a situation where the circuit satisfies the constraint in question; a negative slack characterizes a situation in which the circuit does not.

Hence, the worst-case slack of a pin P of the circuit can be computed as being the minimum, taken across all colors and valid combinations of colors, of the difference between the arrival (forward traversal) and required (backward traversal) token delays, which are recorded at P as the tokens pass through P. It is also normal practice just to speak of the 'slack' of a gate, where implicitly the slack is of the output pin (usually there is only one) of the gate in question, and the slack is the worst-case slack.

The next step of the generic flow pictured in FIG. 1 is logic synthesis 16. Here the circuit is optimized by restructuring its logic. The primary objective is usually to meet the timing constraints as expressed in the previous step, and the secondary objective is usually to minimize circuit area, gate count, or some other cost function such as power consumption. The logic synthesis software uses the difference between token arrival times and token required times to drive its decision making process.

Consider, for example, the two circuits shown in FIGS. 2a and 2b. The two circuits shown both implement the logical AND of five literals A, B, C, D, and E. In FIG. 2a, the function is implemented by a single five-input gate 20, and in FIG. 2b, by a degenerate tree 22 of four two-input gates, 23-26. Neither of these circuits is intrinsically better than the other. The one a synthesis tool ought to choose depends on the arrival times and slacks of the signals A-E. If, for example, all five inputs arrive at the same time and have the same slack, the circuit shown in FIG. 2a is probably better; whereas if E is a relatively late-arriving, low-slack signal, then the circuit shown in FIG. 2b is probably better.

The example discussed above represents only one kind of optimizing decision. There are many other kinds of optimizing decisions that a logic synthesis system can make. Each of these can be characterized by two or more alternative designs or classes of designs, and by a tradeoff between optimizing some properties and degrading others. For example, the path A-F is degraded in the design shown in FIG. 2b of the simple AND-gate example, whereas the path E-F is optimized. Furthermore, area, power, and other cost functions are also affected by these tradeoffs.

Some of these optimizing decision classes are:

<Sharing of high-level functional units such as adders, multipliers, etc. (multiplexing inputs);
<Speculation of high-level functional units (multiplexing outputs);
<Implementation styles of high-level functional units, e.g. the choice of carry-lookahead as opposed to ripple-carry adders;
<The use of complex gates as opposed to collections of simple gates;
<The choice of drive strength within a family of functionally similar gates;
<Input swapping; and
<Functional decomposition.

These decisions have a profound effect on the overall performance and cost of the design.

Following logic synthesis is a retiming step 18. This is not always present because retiming is most useful in the context of a pipelined design. In retiming, registers are repositioned in the design in such a way as to preserve overall functionality while optimizing the achievable clock frequency and register count.

Consider, for example, FIG. 3. In this circuit 30, the maximum achievable clock frequency is determined by the delay on the path A-F1. However, notice that if the flip-flop F1 32 is retimed through the gate G 34, in effect creating two flip-flops on the inputs of G, the maximum clock frequency is improved by the delay of G. If those two flip-flops are then retimed further to the left (see the three routers 32' in the circuit 32' shown in FIG. 4), the clock frequency improves still more.

At this point it is useful to make two observations about the generic synthesis flow being described herein.

First, logic synthesis never changes the population of flip-flops in the design, except in cases where a flip-flop can be completely deleted because there is no path from the flip-flop's output to an output of the circuit as a whole or as the result of a constant propagation process.

In this context, the population of flip-flops of a design can be represented of as the set of Boolean functions that drive flip-flop D pins. Thus, the number of functions in the population determines the number of flip-flops in the design, and the sequential (Mealy machine) behavior of the design is completely described by the union of the flip-flop population and the functions that drive output pins of the design.

Second, retiming only repositions flip-flops, and never changes the circuit other than by deleting and inserting flip-flops. In other words, once logic synthesis has come up with a certain topology for the combinational logic, retiming cannot change that topology. Also, once HDL analysis or retiming has come up with a flip-flop population, logic synthesis cannot change that population. Thus, it is easy to construct examples of circuits where a poor choice of the initial flip-flop population can only be remedied with difficulty if at all.

Consider, for example, the circuits shown in FIGS. 5a and 5b. If retiming moves F 52 one gate to the left in both cases, in FIG. 5a the circuit 50 has five flip-flops, none of which could be removed by logic synthesis. Whereas in the circuit 51 shown in FIG. 5b, moving F one gate to the left results in only two flip-flops.

The salient implication of these properties is that a well-chosen set of initial timing constraints and flip-flop population leads to a better design after retiming. Note however that it is seldom easy to construct a well-chosen constraint set and flip-flop population because the exact positioning of the flip-flops, the delays of the gates, and the clocking constraints collectively determine the slack of the gates and hence the retiming solution. While the delays of the gates cannot be known until after logic synthesis, which chooses the gates and the topology by which the gates are interconnected.

Another observation is that optimizing decisions are driven primarily by the timing slack available at the various gates of the circuit. In other words, two copies of a small region of the circuit tend toward the same general topology if the slacks are the same, almost independently of the surrounding logic.

The constraint generation system should therefore have a property that is henceforth called slack equivalence. Slack equivalence means that for any gate G, the timing slack at G is the same under the initial constraint system and in an optimally retimed version of the circuit. Thus, if the entire circuit is slack-equivalent, logic synthesis sees the same local constraints as if the circuit had already been retimed in a near-optimal way.

Slack equivalence is useful because it allows logic to be optimized independently of the distribution of registers in the design, and hence it alleviates the problem that logic synthesis is unable to change the population of registers.

SUMMARY OF THE INVENTION

The invention provides a method for generating timing constraint systems, where the constrained object is a digital circuit. The constraints are generated for the use of a digital logic optimization (synthesis) tool. The synthesis tool is used to optimize the circuit, under the applied constraints, so that the circuit exhibits certain desirable timing properties, while at the same time minimizing hardware cost and various other properties.

The particular class of timing constraints generated by the described method is useful when the circuit is to be retimed after optimization. Typically, the joint use of the described method and retiming results in improvements in the overall cost/performance tradeoff curve of the design.

The presently preferred embodiment of the method comprises the following steps:
1. The flip-flops of the design are replaced with buffers having a negative delay whose magnitude is approximately the desired clock cycle time of the design; and
2. Cycles in the design are broken using flip-flops having an infinite or quasi-infinite clock frequency.

Following optimization by the synthesis tool, the temporary changes can be reverted, and retiming performed on the circuit.

BRIEF DESCRIPTION OF THE DRAWINGS

FIG. 12 is a diagram showing a computer.

FIG. 13 is a diagram showing various computer readable storage devices.

DETAILED DESCRIPTION OF THE INVENTION

Figure 1:
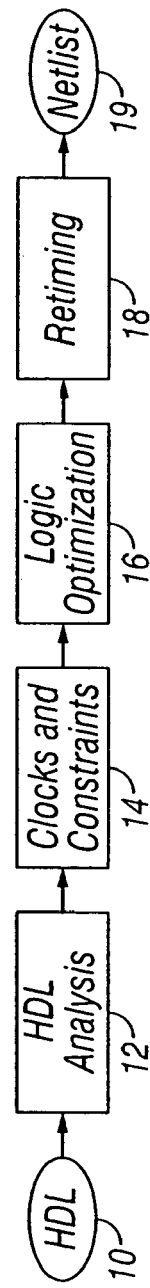
FIG. 1 shows the flow through a generic logic synthesis system that features retiming, according to the prior art.
Figure 2A:
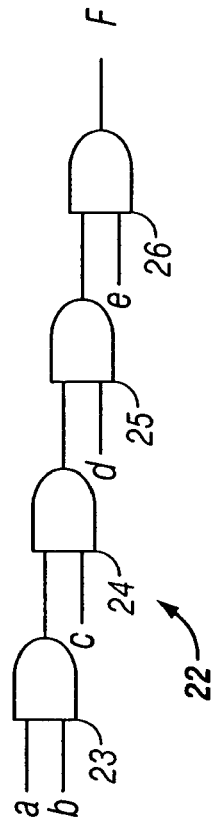
FIGS. 2a and 2b are schematic representations of an AND gate, according to the prior art.
Figure 2B:
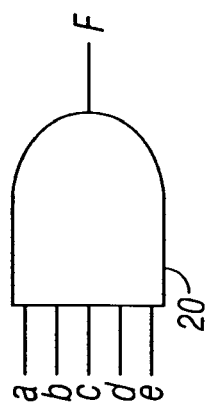
Figure 3:
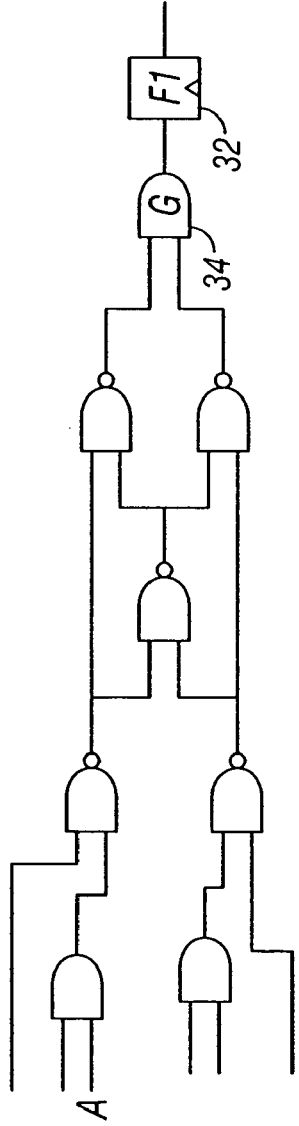
FIG. 3 is a schematic representation of a circuit in which a maximum achievable clock frequency is determined by the delay on the path A-F1, according to the prior art.
Figure 4:
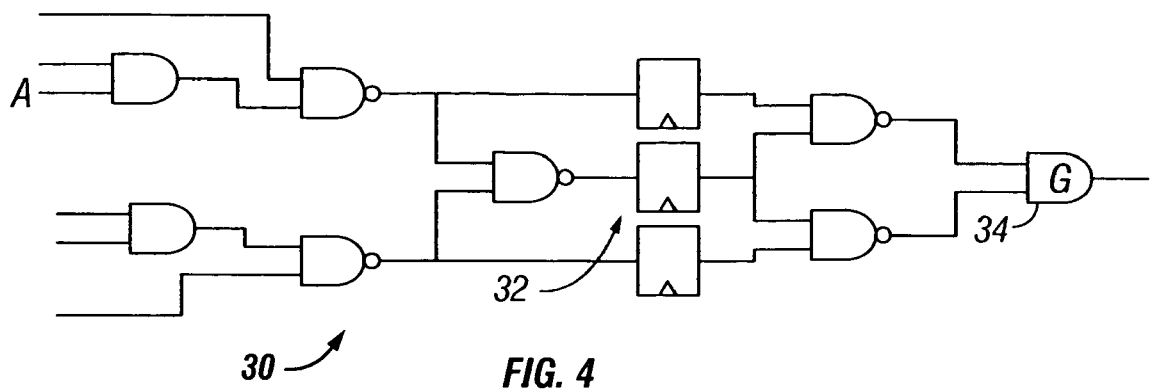
FIG. 4 is a schematic representation of the circuit of FIG. 3, in which a flip-flop F1 is retimed through a gate G, in effect creating two flip-flops F1a and F1b on the inputs of G, according toe the prior art.
Figure 5A:
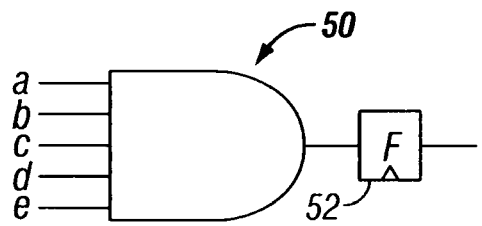
FIGS. 5a and 5b are schematic representations of circuits shown as examples of equivalent logic functions which present different retiming issues, according to the prior art.
Figure 5B:
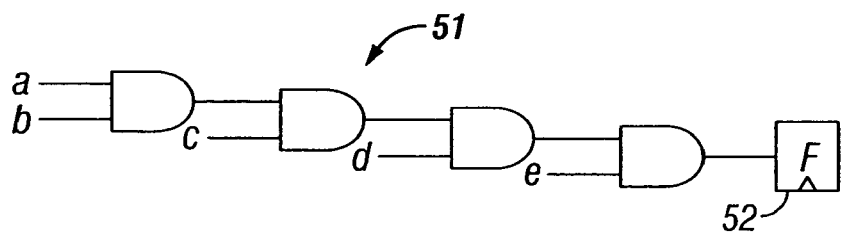

The invention provides a method for generating timing constraint systems, where the constrained object is a digital circuit. The constraints are generated for the use of a digital logic optimization (synthesis) tool. The synthesis tool is used to optimize the circuit, under the applied constraints, so that the circuit exhibits certain desirable timing properties, while at the same time minimizing hardware cost and various other properties.

As mentioned above, one implementation of the invention is a method, This method includes certain operations, described in more detail below. In addition to this method, there are other embodiments. One example is a computer (FIG. 12) including a digital data storage and a digital data processor programmed to perform the foregoing operations. A further embodiment relates to a computer readable storage device (FIG. 12) containing one or more programs executable by a computer to perform the stated operations.

The particular class of timing constraints generated by the described method is useful when the circuit is to be retimed after optimization. Typically the joint use of the described method and retiming results in improvements in the overall cost/performance tradeoff curve of the design.

The presently preferred embodiment of the method comprises the following steps:

1. The flip-flops of the design are replaced with buffers having a negative delay whose magnitude is approximately the desired clock cycle time of the design; and
2. Cycles in the design are broken using flip-flops having an infinite or quasi-infinite clock frequency.

Following optimization by the synthesis tool, the temporary changes can be reverted, and retiming performed on the circuit.

PREFERRED EMBODIMENT

The constraining method herein described is useful in the context of a (digital) logic synthesis system.

The method for generating timing constraints consists of the following steps. Each step is described in greater detail below:

1. The circuit is described using a standard HDL. The descriptions should follow certain style and subset guidelines. These guidelines, and the general practice of describing circuits in HDL texts, are well known to practitioners of the art.
2. A circuit is constructed from the HDL description. This circuit consists of gates and flip-flops, with other features (such as hierarchy) that are irrelevant for the purposes of this invention. This process is also well-known.
3. The flip-flops of the circuit are replaced with negative delay elements. These negative-time elements are implemented by buffers having a delay of approximately $-T$, where T is a delay equal to the flip-flop's clock period less a typical flip-flop delay.
4. If the circuit contains cycles, the cycles are broken by inserting flip-flops clocked by clocks all having a period of zero. As a practical matter, it may be necessary to use a small positive number, such as one femtosecond. However, this number can usually be made so small that it makes no practical difference. It is important to break the cycles only on backward paths where possible.

The design so modified and constrained is now ready for logic synthesis. The steps 2-4 given above have transformed the design into a new design that is independent of the original positioning of registers in the HDL because they have been removed.

The constraint system implicit in the clocks and registers constructed in steps 2-4 above has the desired property of slack equivalence, i.e. the optimization goals at each gate are close to what they would be if the registers were already optimally distributed.

The actual value of T can be set to the clock period of the flip-flop being replaced. However, some adjustments are useful, and add an increment of accuracy to the overall constraint system.

1. The buffer used to replace the flip-flop is given a 'typical' load capacitance Ct, computed by taking an average or weighted-average load capacitance over the inputs of all of the gates and flip-flop D pins in the target technology library.
2. The value of T is best described using a capacitance/delay curve representing a composite of the gates in the library, the Q pins of the flip-flops in the library, and a series of increasingly powerful buffer trees. The curve is first computed, then it is offset by setting the delay corresponding to the average load capacitance Ct to $-T$. Thus, a capacitive load larger than Ct results in a longer delay, i.e. a potentially positive net delay if the load is great enough. Conversely, if a smaller load is imposed, the delay is $-(T+t)$, where t is the (positive) difference in delay between the typical load and the lesser load.

In one alternative embodiment of the invention, it is possible to construct point-to-point timing constraints instead of negative-delay element. This is straightforward for simple cases but becomes somewhat more difficult when offset inputs and outputs, complex cycles, and/or feed-forward paths are present.

In another alternative embodiment, a system of clocks and artificial flip-flops can be constructed that creates slack equivalence by the following steps:

1. Assign inputs to stage 0.
2. Compute the length of the longest path from any input to each output.
3. Assign the outputs to stages as denoted by the longest path length.
4. Add skips (1T delays) where alternative paths are shorter than the longest path.
5. Establish a series of clocks $\{C_0, C_1, C_2, \ldots\}$ with a long clock period and a phase delay of T between successive members of the series.
6. For each output and input, construct a dummy flip-flop. Clock the flip-flop with the clock whose subscript is the stage to which the input or output has been assigned.

This alternative can also provide for loops, but the description of the method becomes complex and the whole approach leads to some significant difficulties.

Following logic optimization, the registers can be reinstalled in place of the negative-delay elements, and all of the cycle-breaking flip-flops can be removed, after which a retiming algorithm can be applied. Finally, after retiming, a second logic optimization pass can be performed to fine-tune the retimed design.

Figure 6:
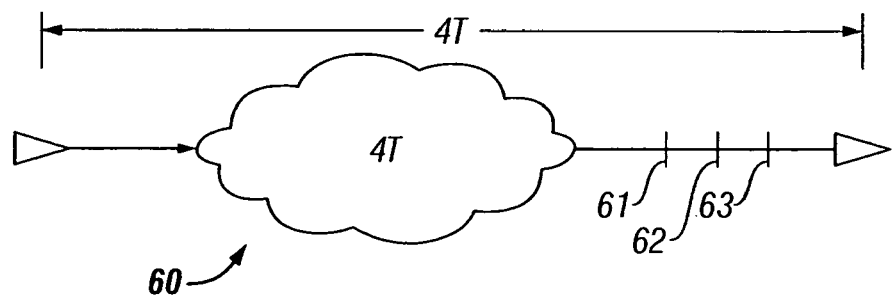
FIG. 6 is a schematic representation of a circuit to which a retiming algorithm can be applied, according to the prior art.
Figure 7:
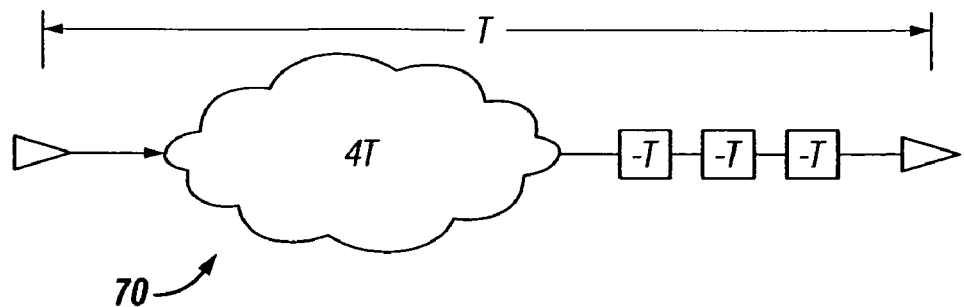
FIG. 7 is a schematic representation of the circuit of FIG. 6 as modified by adding negative delays and deleting registers in accordance with the invention.

The example circuit shown in FIG. 6 is used to illustrate how the method is applied in a simple case. The example shows a circuit 60, shown as a blob of undifferentiated random logic, followed by three register banks 61-63. For purposes of exposition, it is assumed that the blob is acyclic and contains no further registers. Further suppose that the total combinational delay of the combinational blob would be, if it were optimally synthesized, a little less than 4T. Now suppose that the designer intends to retime the circuit, using the three banks of registers to form a four-stage pipeline having a desired clock period T. The circuit as modified by adding negative delays and deleting registers in accordance with the invention looks like the circuit 70 shown in FIG. 7.

The path delay beginning at the input and ending at the output is now 4T−3T=T. Because the original clock period constraint is applied to the input and output ports of the design in the usual way, i.e. such that the delay between an input and an output is T, the constraints and the path delay are equal, so the circuit is slack-equivalent and tends to be optimized in the correct way.

The property of slack equivalence is preserved by this technique for all acyclic circuits. This can be seen by considering any path beginning at an input and ending at an output. The original and retimed circuits each have the same number k of flops along this path; so it has −kT delay due to the negative-delay insertion step.

Figure 8:
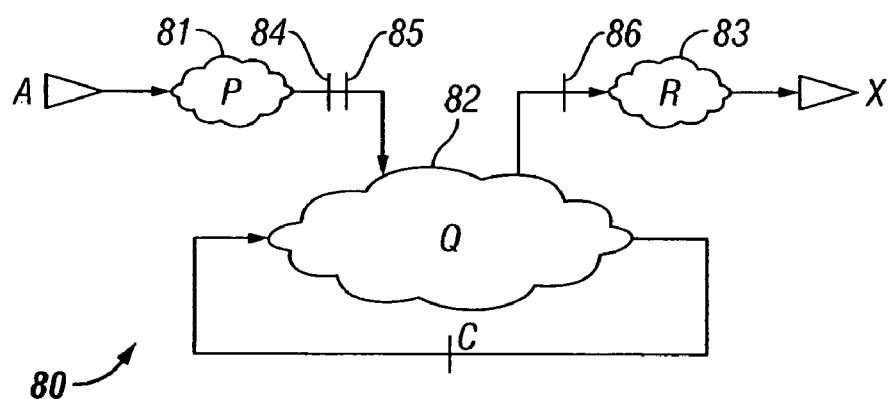
FIG. 8 is a schematic representation of an example circuit that illustrates how the steps of the invention modify a general procedure when cycles are present, according to the prior art.

FIG. 8 shows an example circuit 80 that explains how the steps of the invention modify the general procedure when cycles are present. This example shows a circuit with three blobs P, Q, and R, 81-82 respectively, of combinational logic. There is one cycle C having a path length of one, and there is one input A and one output X.

After all of the registers 84-86 of the circuit have been replaced by −T delays, there is a combinational cycle beginning and ending at Q. The solution in this case is to add a new register 87 (FIG. 9), breaking the loop, possibly at the same location as the negative delay at C. To have the loop delay add up correctly, this register must have a clock period that is substantially zero.

Now slack equivalence is preserved for a gate in P or R by the fact that they are both constrained only by the path beginning at A and ending at X. This path is of length 3 and delay 4T.

The logic in P is not constrained by any slack analysis involving register 87 because any timing-analysis tokens originating at A can only arrive at the output at X and the register C. The register at C is sensitive only to tokens that originate at C, so other tokens have no effect on timing analysis when they arrive at C. Similarly, such tokens can only originate at C and only have an effect at C. When they arrive at X they are ignored.

Furthermore, the logic in the center part of Q is constrained both by the delay going around the cycle and by the delay going from A to X. The logic synthesis software optimizes these gates in accordance with the most constraining of the slacks induced by the paths A-X and C-C.

Figure 9:
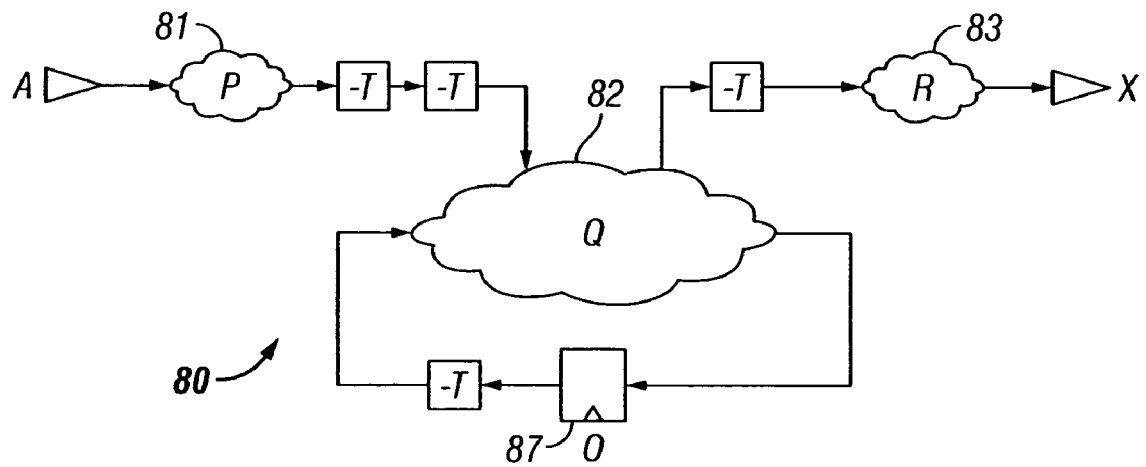
FIG. 9 is a schematic representation of the circuit of FIG. 8 as modified by adding negative delays and deleting registers in accordance with the invention.
Figure 10:
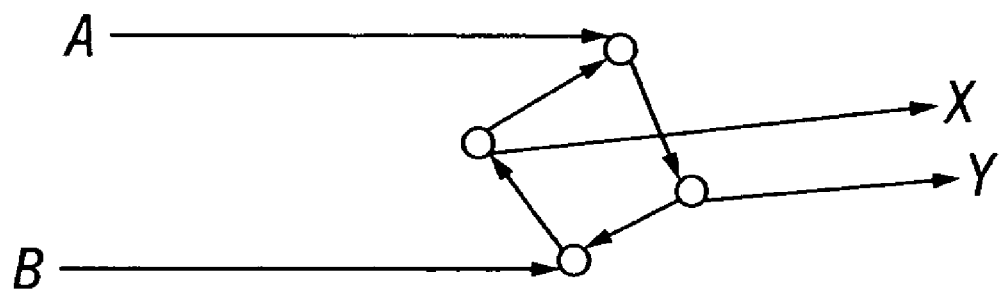
FIG. 10 is a schematic representation of a circuit in which there is no way to break the cycle without breaking at least one forward path, according to the prior art.
Figure 11:
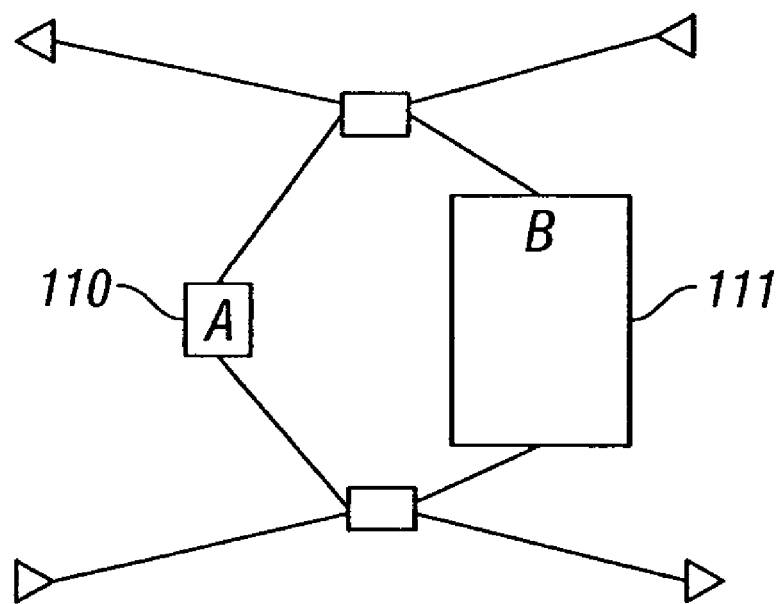
FIG. 11 is a schematic representation of a circuit in which a forward path may be broken according to the invention.

Note that in the example of FIG. 9, it was possible to insert the flip-flop C in such a way that no forward path, i.e. no path from A to X and containing no cycle, was broken. Finding such points is not always possible. Consider, for example, the graph shown in FIG. 10. In this example there is no way to break the cycle without breaking at least one forward path. In many other cases, it is possible to break the cycle without breaking the forward paths by using the following algorithm:

```
mark all forward paths, e.g. by using depth-first search
while there are unbroken cycles
    choose a cycle C
    traverse C looking for an edge E such that E is not marked as forward
    if such an E is found, break E
    else choose an E such that it does the least damage when broken
        and break E
end
```

This algorithm breaks all cycles, so it is effective. It attempts to minimize the damage done when a forward path is broken; but for this some heuristic must be used.

The best such heuristic known at this time is to break the forward edge E that belongs to acyclic path from input to output with minimum of logic on it. This minimizes the impact of the wrong decisions made during logic synthesis because of losing the property of slack equivalence on certain parts of the circuit. For example, for the reasons explained above it is less damaging to break the cycle at A 110, which is shown smaller in size than B to indicate less logic, rather than at B 111.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

The invention claimed is:

1. A method for generating timing constraints, comprising the steps of:
    describing a digital circuit using a hardware description language (HDL);
    preparing a digital circuit representation from said HDL description;
    removing flip-flops from said digital circuit representation using a computer;
    replacing said removed flip-flops with negative delay elements; and
    breaking any feedback paths in the digital circuit representation by inserting dummy flip-flops clocked by clocks having a prescribed period.

2. The method of claim 1, wherein said negative delay elements are implemented by buffers having a delay −T, where T is a delay equal to a flip-flop's clock period less a predetermined flip-flop delay.

3. The method of claim 2, wherein T is set to a clock period of a flip-flop being replaced.

4. The method of claim 1, where said step of breaking said feedback paths includes determining if said feedback paths can be broken without breaking any feedforward paths, where the breaking operation is conducted so as to maintain feedforward paths except where said determining operation answers in the negative.

5. The method of claim 1, where said replacing step is conduced so that predetermined optimization goals at each gate are substantially the same as they would be if registers were already optimally distributed.

6. The method of claim 1, further comprising the steps of:
    after said replacing and breaking steps, optimizing logic of said digital circuit representation;
    after said optimizing, reinstalling registers in place of said negative-delay elements and removing all dummy flip-flops;
    applying a retiming process to reposition registers to optimize timing slack and register count while preserving the optimized logic, said operation of applying the retiming process producing a retimed design; and
    after retiming, applying further logic optimization to the retimed design.

7. The method of claim 1, where the prescribed period is one femtosecond or less.

8. A method for generating timing constraints, comprising the steps of:
    describing a digital circuit using a hardware description language (HDL);

preparing a digital circuit representation from said HDL description;
removing flip-flops from said digital circuit representation using a computer;
replacing said removed flip-flops with negative delay elements; and
where some of the negative delay elements comprise buffers, said buffers having a load capacitance representing an average or weighted-average load capacitance taken over inputs of all gates and flip-flop D pins in a target technology library.

9. A method for generating timing constraints, comprising operations of:
describing a digital circuit using a hardware description language (HDL);
preparing a digital circuit representation from said HDL description;
replacing flip-flops in said digital circuit representation with negative delay elements using a computer;
wherein said negative-time elements are implemented by buffers having a delay −T, where T is a delay equal to a flip-flop's clock period less a predetermined flip-flop delay;
describing a value of T using a capacitance/delay curve representing a composite of gates in a target technology library, Q pins of flip-flops in said target technology library, and a series of increasingly powerful buffer trees;
wherein said curve is first computed, then it is offset by setting a delay corresponding to a predetermined load capacitance to −T;
whereby a larger capacitive load results in a longer delay; and
whereby if a near-zero load is imposed a delay is −(T+t), where t is a (positive) difference in delay between a predetermined load and a lesser load.

10. A method for generating timing constraints, comprising the steps of:
a step for describing a digital circuit using a hardware description language (HDL);
a step for preparing a digital circuit representation from said HDL description;
a step for removing flip-flops from said digital circuit representation and replacing said removed flip-flops with negative delay elements; and
a step for breaking any feedback paths in the digital circuit representation by inserting dummy flip-flops clocked by clocks all having a prescribed period using a computer.

11. A computer readable storage device containing one or more programs executable by a computer to perform operations comprising:
receiving a description of a digital circuit using a hardware description language (HDL) and preparing a digital circuit representation from said HDL description;
removing flip-flops from said digital circuit representation and replacing said removed flip-flops with negative delay elements; and
breaking any feedback paths in the digital circuit representation by inserting dummy flip-flops clocked by clocks all having a prescribed period.

12. A computer readable storage device containing one or more programs executable by a computer to perform operations comprising:
receiving a description of a digital circuit using a hardware description language (HDL) and preparing a digital circuit representation from said HDL description;
replacing flip-flops in said digital circuit representation with negative delay elements;
wherein said negative-time elements are implemented by buffers having a delay −T, where T is a delay equal to a flip-flop's clock period less a predetermined flip-flop delay;
describing a value of T using a capacitance/delay curve representing a composite of gates in a target technology library, Q pins of flip-flops in said target technology library, and a series of increasingly powerful buffer trees;
wherein said curve is first computed, then it is offset by setting a delay corresponding to a predetermined load capacitance to −T;
whereby a larger capacitive load results in a longer delay; and
whereby if a near-zero load is imposed a delay is −(T+t), where t is a (positive) difference in delay between a predetermined load and a lesser load.

13. A computer driven system for generating timing constraints, comprising:
digital data storage;
coupled to the digital data storage, a digital data processor programmed to perform operations comprising:
receiving a description of a digital circuit using a hardware description language (HDL) and preparing a digital circuit representation from said HDL description;
removing flip-flops from said digital circuit representation and replacing said removed flip-flops with negative delay elements; and
breaking any feedback paths in the digital circuit representation by inserting dummy flip-flops clocked by clocks all having a prescribed period.

14. A computer readable storage device containing one or more programs executable by a computer to perform operations comprising:
receiving a description of a digital circuit using a hardware description language (HDL) and preparing a digital circuit representation from said HDL description;
removing flip-flops from said digital circuit representation and replacing said removed flip-flops with negative delay elements; and
where some of the negative delay elements comprise buffers, said buffers having a load capacitance representing an average or weighted-average load capacitance taken over inputs of all gates and flip-flop D pins in a target technology library.

15. A computer driven system for generating timing constraints, comprising:
digital data storage;
coupled to the digital data storage, a digital data processor programmed to perform operations comprising:
receiving a description of a digital circuit using a hardware description language (HDL) and preparing a digital circuit representation from said HDL description;
removing flip-flops from said digital circuit representation and replacing said removed flip-flops with negative delay elements; and
where some of the negative delay elements comprise buffers, said buffers having a load capacitance representing an average or weighted-average load capacitance taken over inputs of all gates and flip-flop D pins in a target technology library.

* * * * *

UNITED STATES PATENT AND TRADEMARK OFFICE
CERTIFICATE OF CORRECTION

| | | |
|---|---|---|
| PATENT NO. | : 7,584,441 B2 | |
| APPLICATION NO. | : 10/665880 | |
| DATED | : September 1, 2009 | |
| INVENTOR(S) | : Alexander Gidon and David Knapp | |

It is certified that error appears in the above-identified patent and that said Letters Patent is hereby corrected as shown below:

On the title page, Item (57) the first line of the Abstract should be corrected as follows:

--A method for generating timing constraint systems, where the constrained object is a digital circuit[[.]], is provided, where the constraints are generated for the use of a digital logic optimization (syntheses) tool.--

Signed and Sealed this

Seventeenth Day of November, 2009

David J. Kappos
*Director of the United States Patent and Trademark Office*